United States Patent [19]

Hull et al.

[11] Patent Number: 5,796,312
[45] Date of Patent: Aug. 18, 1998

[54] MICROCONTROLLER WITH FIRMWARE SELECTABLE OSCILLATOR TRIMMING

[75] Inventors: Richard L. Hull, Chandler; Gregory C. Bingham, Gilbert, both of Ariz.

[73] Assignee: Microchip Technology Incorporated, Chandler, Ariz.

[21] Appl. No.: 644,914

[22] Filed: May 24, 1996

[51] Int. Cl.[6] .......................... H03K 3/0231; H03L 1/00
[52] U.S. Cl. .......................... 331/44; 331/143; 331/175; 331/177 R
[58] Field of Search .......................... 331/44, 177 R, 331/175, 143

[56] References Cited

U.S. PATENT DOCUMENTS

| | | | |
|---|---|---|---|
| 4,964,141 | 10/1990 | Matsushima et al. | 375/354 |
| 5,036,300 | 7/1991 | Nicolai | 331/143 |
| 5,272,650 | 12/1993 | Adams et al. | 331/1 A |
| 5,583,819 | 12/1996 | Roesner et al. | 327/525 |

*Primary Examiner*—Siegfried H. Grimm
*Attorney, Agent, or Firm*—Harry M. Weiss; Jeffrey D. Moy; Harry M. Weiss & Associates, P.C.

[57] ABSTRACT

A microcontroller circuit having firmware selectable oscillator trimming includes, in combination, a microcontroller, an oscillator located within the microcontroller for providing a system clock signal for the microcontroller, and a memory portion for providing trimming data to the oscillator for trimming frequency of the system clock. The microcontroller circuit includes microcontroller logic which has the trimming data stored therein for transfer to the memory portion. Additionally, the microcontroller logic permits the user to alter the trimming data after it has been transferred to the memory portion, thereby permitting the user to alter the amount of modification of the system clock frequency from the amount associated with the trimming data.

19 Claims, 2 Drawing Sheets

MICROCONTROLLER WITH FIRMWARE SELECTABLE OSCILLATOR TRIMMING

RELATED APPLICATION

This patent application is related to U.S. patent application entitled "Accurate RC Oscillator," having Ser. No. 08/499,602 and a filing date of Jul. 11, 1995, now U.S. Pat. No. 5,565,819, in the name of Russell E. Cooper as inventor, and is incorporated herein by reference. This patent application is also related to U.S. patent application Ser. No. 08/644,917, filed May 24, 1996, now U.S. Pat. No. 5,670,915, entitled "Accurate RC Oscillator Having Peak-to-Peak Voltage Control," and filed in the names of Russell Cooper and Scott Ellison as inventors, and is incorporated herein by reference.

BACKGROUND OF THE INVENTION

1. Field of the Invention

This invention is in the field of microcontrollers and methods therefor and, more particularly, is a microcontroller having firmware selectable oscillator trimming and a method therefore.

2. Description of the Related Art

In the past, most microcontroller users would rely on external oscillators to provide an accurate clock signal to the microcontroller. This approach has the advantage of yielding an accurate clock signal to the microcontroller, however it has the inherent disadvantages of higher costs associated with using an external clock source and inefficient use of space since an external oscillator and its associated components are required in addition to the microcontroller. Thus, it would be advantageous both in terms of cost reduction and space savings to have an oscillator internal to the microcontroller chip itself, but those skilled in the art know that process variations inherent in the manufacturing procedure for the microcontroller chip typically yield oscillators on the chip that have imprecise output clock frequency.

Therefore, there existed a need to provide a microcontroller having an internal RC oscillator circuit which provides a clock signal for use by the microcontroller that can be modified, as desired, by firmware selectable oscillator trimming of the clock signal frequency and a method therefor.

SUMMARY OF THE INVENTION

An object of the present invention is to provide a microcontroller having an internal oscillator supplying a clock signal to the microcontroller and a method therefor.

Another object of the present invention is to provide a microcontroller with firmware selectable oscillator trimming of the oscillator clock signal and a method therefor.

BRIEF DESCRIPTION OF THE PREFERRED EMBODIMENTS

According to the present invention, a microcontroller circuit having firmware selectable oscillator trimming is disclosed comprising, in combination, a microcontroller, oscillator means located within the microcontroller for providing a system clock signal for the microcontroller, and memory means coupled to the oscillator means for providing signals to the oscillator means for trimming frequency of the system clock. The microcontroller circuit further includes microcontroller logic means having trimming data stored therein for providing the trimming data to the memory means. The microcontroller logic means also includes oscillator control means therein for selecting between use of the oscillator means internal to the microcontroller for the system clock and use of an external oscillator source for the system clock.

The microcontroller circuit also includes oscillator logic means coupled to the microcontroller logic means, to the oscillator means, and to the external oscillator source for providing, in response to receipt of a signal from the oscillator control means, the system clock to the microcontroller from one of the oscillator means and the external oscillator source. The memory means comprises Static Random Access Memory (SRAM) having control register means for storing the trimming data and supplying the trimming data to the oscillator means. SRAM address, Data, Read, and Write lines are located between the microcontroller logic means and the SRAM. Additionally, the microcontroller circuit includes a plurality of lines coupling the control register means with the oscillator means for transferring the trimming data to the oscillator means. The microcontroller circuit further includes trimming data adjustment means within the microcontroller logic means for altering the trimming data after the trimming data has been transferred to the memory means.

As an alternative embodiment, a method of operating a microcontroller circuit having firmware selectable oscillator trimming is disclosed comprising the steps of providing a microcontroller, providing a system clock signal to the microcontroller from oscillator means located within the microcontroller, and providing memory means coupled to the oscillator means for providing signals to the oscillator means for trimming frequency of the system clock. The method further includes the step of providing microcontroller logic means having trimming data stored therein for providing the trimming data to the memory means. The step of providing the microcontroller logic means also includes the step of providing oscillator control means therein for selecting between use of the oscillator means internal to the microcontroller for the system clock and use of an external oscillator source for the system clock.

The method further includes the step of providing oscillator logic means coupled to the microcontroller logic means, to the oscillator means, and to the external oscillator source for providing, in response to receipt of a signal from the oscillator control means, the system clock to the microcontroller from one of the oscillator means and the external oscillator source. The step of providing the memory means comprises the step of providing Static Random Access Memory (SRAM) having control register means for storing the trimming data and supplying the trimming data to the oscillator means. SRAM address, Data, Read, and Write lines are provided between the microcontroller logic means and the SRAM. The method also includes the step of providing a plurality of lines coupling the control register means with the oscillator means for transferring the trimming data to the oscillator means. The method further includes the step of providing trimming data adjustment means within the microcontroller logic means for altering the trimming data after the trimming data has been transferred to the memory means.

The foregoing and other objects, features, and advantages of the invention will be apparent from the following, more particular, description of the preferred embodiments of the invention, as illustrated in the accompanying drawing.

DESCRIPTION OF THE PREFERRED EMBODIMENTS

Figure 1:
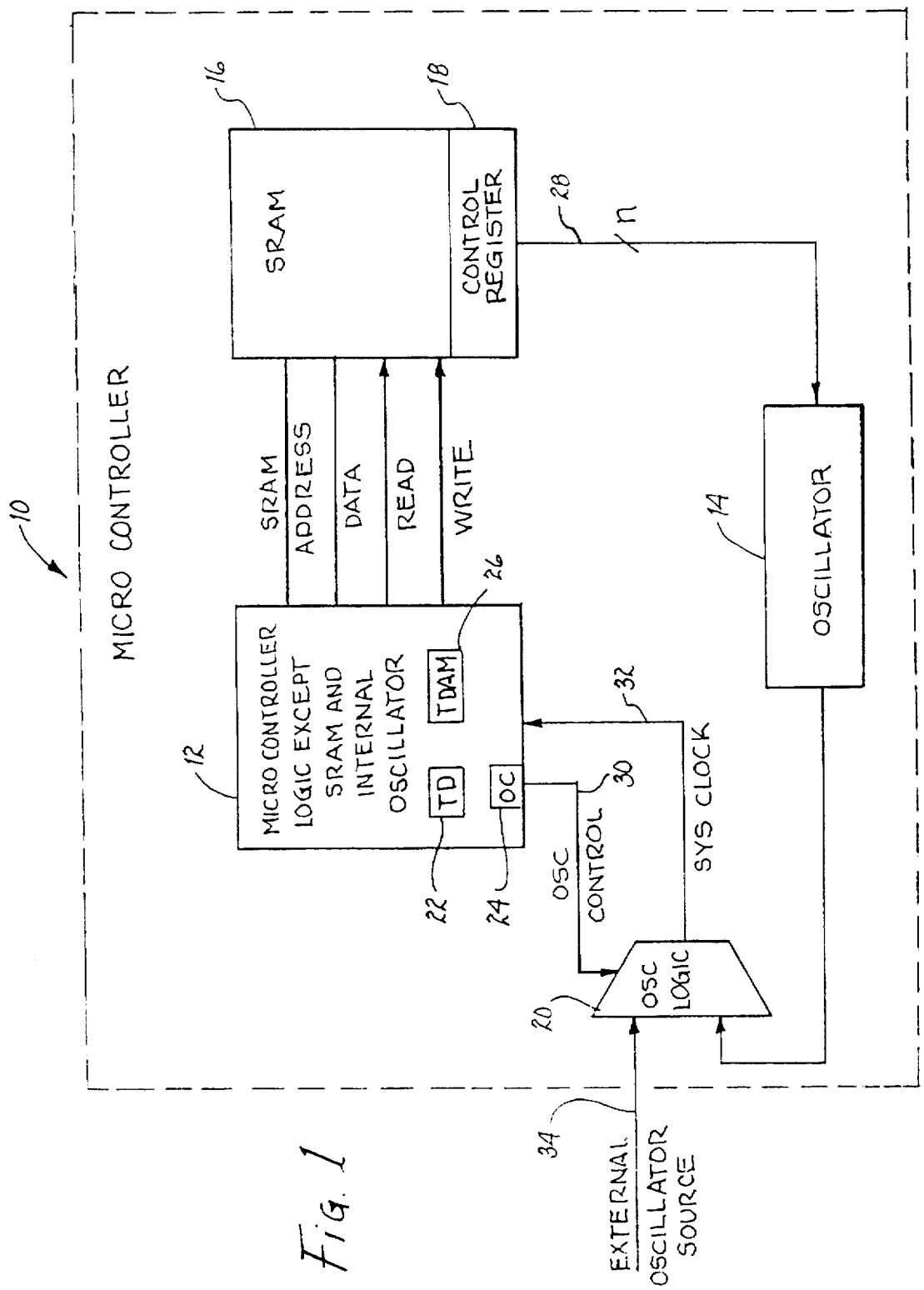
FIG. 1 is a simplified block diagram view of the microcontroller with firmware selectable oscillator trimming of the instant invention.
Figure 2:
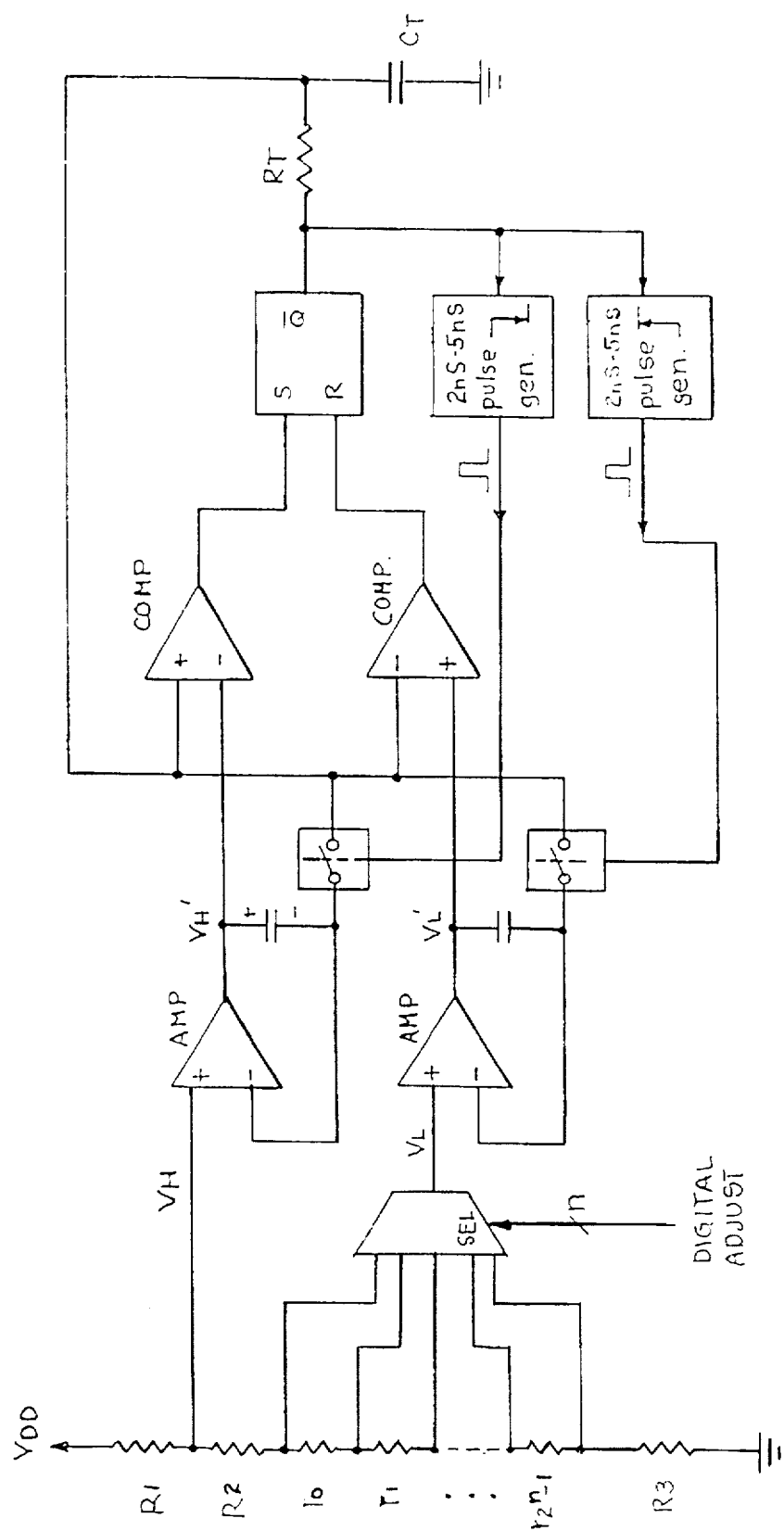
FIG. 2 is a simplified block diagram of the internal oscillator used with the microcontroller depicted in FIG. 1.

Referring to FIG. 1, the microcontroller circuit having firmware selectable oscillator trimming (hereinafter simply referred to as microcontroller) is shown and designated by general reference number 10. Microcontrollers are well known in the art. Most microcontrollers use an external clock source because they are inherently accurate, as compared to providing an internal oscillator, which is inherently inaccurate, for use by the microcontroller. The instant invention uses an oscillator 14 located within the microcontroller 10 for providing a system clock signal over line 32 to the microcontroller 10. Oscillators are well known in the art; however, providing an oscillator with an accurate clock signal on a microcontroller chip is not well known. Despite being located within the microcontroller 10, oscillator 14 does provide a precise clock signal, and the structure thereof is shown in FIG. 2, and operation of oscillator 14 is discussed in detail in U.S. patent application Ser. No. 08/644,917, filed May 24, 1996, now U.S. Pat. No. 5,670,915, and entitled "Accurate RC Oscillator Having Peak-to-Peak Voltage Control."

The microcontroller 10 also includes a memory portion (SRAM) 16 coupled to the oscillator 14 for providing signals to the oscillator 14 for trimming frequency of the system clock. Note that other types of volatile memory could be implemented in lieu of the SRAM 16. A microcontroller logic portion 12 is also included within the microcontroller 10, and it has trimming data 22 stored therein for providing the trimming data 22 to the memory portion 16. In general, microcontroller logic portion 12 includes logic well known in the art to accomplish basic microcontroller functions. In addition, microcontroller logic portion 12 has a dedicated non-volatile memory location for storing the trimming data 22. The trimming data 22 is determined empirically upon fabrication of the microcontroller 10 to achieve a desired frequency of the clock signal from oscillator 14 for a given set of temperature, voltage, and process variation conditions. In other words, after fabrication of the microcontroller 10, it is tested at various temperatures and voltages, and with the physical variations of the internals of the chip associated with fabrication, to determine what value of trimming data 22 will achieve the desired clock frequency. This value is located within the microcontroller logic portion 12. The microcontroller logic portion 12 also includes an oscillator control portion 24 therein for selecting between use of the oscillator 14 and an external oscillator source 34 for the system clock. The oscillator control portion 24 consists of a non-volatile bit within the microcontroller logic portion 12 set with appropriate data for selecting the desired source for the system clock.

The microcontroller 10 also includes an oscillator logic portion 20 for providing, in response to receipt of a signal from the oscillator control portion 24, the system clock to the microcontroller 10 from either the oscillator 14 or the external oscillator source 34. Logic to accomplish the task of the oscillator logic portion 20 is well known to those skilled in the art; however, while the logic to accomplish this task is well known, the particular function performed by the oscillator logic portion 20, in the context of microcontroller 10, is unique.

As previously noted, the memory portion 16 comprises Static Random Access Memory (SRAM). The SRAM 16 has a control register portion 18 for storing the trimming data 22 and supplying the trimming data 22 to the oscillator 14. The microcontroller 10 further includes SRAM address, Data, Read, and Write lines between the microcontroller logic portion 12 and the SRAM 16. Additionally, a plurality of lines 28 couple the control register portion 18 with the oscillator 14 for transferring the trimming data 22 to the oscillator 14. The microcontroller logic portion 12 further includes a trimming data adjustment portion 26 for permitting a user to alter the trimming data 22 after it has been transferred to the SRAM 16. In practice, a user would take adjustment data provided by the manufacturer to meet the temperature and voltage conditions of his or her application and apply this data to the microcontroller logic portion 12 which would deliver this adjustment data to the SRAM 16 to modify the trimming data 22 accordingly. Logic to accomplish this function is well known to those skilled in the art; however, the practice of adjusting trimming data 22 transferred from the microcontroller logic portion 12 into SRAM 16 is unique.

OPERATION

Again referring to FIG. 1, a user obtains from the manufacturer a microcontroller 10 having the trimming data 22 and oscillator control portion 24 set in firmware, as desired. In particular, the user obtains a microcontroller 10 having trimming data 22 set in firmware which is appropriate for the user's application with respect to temperature and voltage conditions, and the process variations associated with the microcontroller 10 itself. Likewise, the user selects a microcontroller 10 having the appropriate data set in firmware for the oscillator control portion 24 such that the user can provide the system clock to the microcontroller 10 from either oscillator 14 or the external oscillator source 34, as desired.

Upon appropriate command, well known in the art, from the user, the oscillator control portion 24 provides a signal over line 30 to the oscillator logic portion 20 to select the source for the system clock from either the oscillator 14 or the external oscillator source 34. Thereafter, the system clock is provided from the output of the oscillator logic portion 20 for use by the microcontroller 10.

Again, upon appropriate command, well known in the art, from the user, the trimming data 22 is transferred from the microcontroller logic portion 12 to the SRAM 16, and more particularly into the control register portion 18. The trimming data 22 in the control register portion 18 is automatically fed to the oscillator 14 over lines 28. As previously mentioned, the particular operation of oscillator 14 is described in U.S. patent application Ser. No. 08/644,917, filed May 24, 1996, now U.S. Pat. No. 5,670,915, and entitled "Accurate RC Oscillator Having Peak-to-Peak Voltage Control," however, note that operation of the oscillator 14 with the trimming data 22 transferred therein yields a substantially precise system clock frequency in spite of the fact that oscillator 14 is integral to the microcontroller 10 chip.

The aforementioned loading of trimming data 22 into the oscillator 14 assumes that the user is satisfied with the value of trimming data 22 in firmware of the microcontroller logic portion 12. This is not always the case. A user may want to adjust the operating frequency of the system clock by trimming a small amount, or even by changing the frequency by a large amount. Accordingly, the microcontroller logic portion 12 further includes a trimming data adjustment portion 26 for permitting a user to alter the trimming data 22 after it has been transferred into the SRAM 16. In practice, a user would take adjustment data provided by the manufacturer to meet the temperature and voltage conditions of his or her application and, using commands well known to those skilled in the art, apply this data to the microcontroller logic portion 12 which would deliver this adjustment data to the SRAM 16 to modify the trimming data 22 accordingly. Last, note that communication protocol over the SRAM Address, Data, Read, and Write lines is well known to those skilled in the art, and therefore, the particulars of transferring data, whether it be trimming data 22, data from the trimming data adjustment portion 26, or otherwise, between the microcontroller logic portion 12 and the SRAM 16 are well known to those skilled in the art.

Although the invention has been particularly shown and described with reference to a preferred embodiment thereof, it will be understood by those skilled in the art that changes in form and detail may be made therein without departing from the spirit and scope of the invention.

What is claimed is:

1. A microcontroller circuit having firmware selectable oscillator trimming comprising, in combination:

a microcontroller;

oscillator means located within said microcontroller for providing a system clock signal for said microcontroller wherein said oscillator means generating an oscillatory signal of a predetermined frequency across a series resistor-capacitor (RC) network by ensuring that the oscillatory signal accurately oscillates between first and second voltages generated from a supply voltage source where the frequency of oscillation is determined by both the time constant of the RC network and the difference between the first and second voltages, said oscillator means comprising, in combination:

charging-discharging means for discharging a voltage across the capacitor commencing when voltage of the oscillatory signal exceeds a first threshold voltage and for charging said voltage across the capacitor commencing when voltage of the oscillatory signal falls below a second threshold voltage;

first sampling means coupled to said charging-discharging means for obtaining a first sampled voltage of the oscillatory signal upon commencement of discharging of said voltage across the capacitor;

first compensation means coupled to said first sampling means for adjusting said first threshold voltage to be the first voltage modified by a voltage difference between the first voltage and said first sampled voltage;

second sampling means coupled to said charging-discharging means for obtaining a second sampled voltage of the oscillatory signal upon commencement of charging of said voltage across the capacitor;

second compensation means coupled to said second sampling means for adjusting said second threshold voltage to be the second voltage modified by a voltage difference between the second voltage and said second sampled voltage; and differential voltage setting means coupled to said second compensation means for selecting the second voltage from a plurality of different possible voltages and thereby selecting a voltage difference between the first and second voltages; and memory means coupled to said oscillator means for providing signals to said oscillator means for trimming frequency of said system clock.

2. The microcontroller circuit of claim 1 further including microcontroller logic means having trimming data stored therein for providing said trimming data to said memory means.

3. The microcontroller circuit of claim 2 wherein said microcontroller logic means also includes oscillator control means therein for selecting between use of said oscillator means internal to said microcontroller for said system clock and use of an external oscillator source for said system clock.

4. The microcontroller circuit of claim 3 further including oscillator logic means coupled to said microcontroller logic means, to said oscillator means, and to said external oscillator source for providing, in response to receipt of a signal from said oscillator control means, said system clock to said microcontroller from one of said oscillator means and said external oscillator source.

5. The microcontroller circuit of claim 2 wherein said memory means comprises Static Random Access Memory (SRAM) having control register means for storing said trimming data and supplying said trimming data to said oscillator means.

6. The microcontroller circuit of claim 5 further including SRAM address, data, read, and write lines between said microcontroller logic means and said SRAM.

7. The microcontroller circuit of claim 5 further including a plurality of lines coupling said control register means with said oscillator means for transferring said trimming data to said oscillator means.

8. The microcontroller circuit of claim 1 wherein said memory means is located within said microcontroller.

9. The microcontroller circuit of claim 2 further including trimming data adjustment means within said microcontroller logic means for altering said trimming data after said trimming data has been transferred to said memory means.

10. A method of operating a microcontroller circuit having firmware selectable oscillator trimming comprising the steps of:

providing a microcontroller;

providing a system clock signal to said microcontroller from oscillator means located within said microcontroller, said oscillator means generating an oscillatory signal of a predetermined frequency across a series resistor-capacitor (RC) network by ensuring that the oscillatory signal accurately oscillates between first and second voltages generated from a supply voltage source where the frequency of oscillation is determined by both the time constant of the RC network and the difference between the first and second voltages, said oscillator means comprising, in combination:

charging-discharging means for discharging a voltage across the capacitor commencing when voltage of the oscillatory signal exceeds a first threshold voltage and for charging said voltage across the capacitor commencing when voltage of the oscillatory signal falls below a second threshold voltage;

first sampling means coupled to said charging-discharging means for obtaining a first sampled voltage of the oscillatory signal upon commencement of discharging of said voltage across the capacitor;

first compensation means coupled to said first sampling means for adjusting said first threshold voltage to be the first voltage modified by a voltage difference between the first voltage and said first sampled voltage;

second sampling means coupled to said charging-discharging means for obtaining a second sampled voltage of the oscillatory signal upon commencement of charging of said voltage across the capacitor;

second compensation means coupled to said second sampling means for adjusting said second threshold voltage to be the second voltage modified by a voltage difference between the second voltage and said second sampled voltage; and differential voltage setting means coupled to said second compensation means for selecting the second voltage from a plurality of different possible voltages and thereby selecting a voltage difference between the first and second voltages; and providing memory means coupled to said oscillator means for providing signals to said oscillator means for trimming frequency of said system clock.

11. The method of claim 10 further including the step of providing microcontroller logic means having trimming data stored therein for providing said trimming data to said memory means.

12. The method of claim 11 wherein said step of providing said microcontroller logic means also includes the step of providing oscillator control means therein for selecting between use of said oscillator means internal to said microcontroller for said system clock and use of an external oscillator source for said system clock.

13. The method of claim 12 further including the step of providing oscillator logic means coupled to said microcontroller logic means, to said oscillator means, and to said external oscillator source for providing, in response to receipt of a signal from said oscillator control means, said system clock to said microcontroller from one of said oscillator means and said external oscillator source.

14. The method of claim 11 wherein said step of providing said memory means comprises the step of providing Static Random Access Memory (SRAM) having control register means for storing said trimming data and supplying said trimming data to said oscillator means.

15. The method of claim 14 further including the step of providing SRAM address, data, read, and write lines between said microcontroller logic means and said SRAM.

16. The method of claim 14 further including the step of providing a plurality of lines coupling said control register means with said oscillator means for transferring said trimming data to said oscillator means.

17. The method of claim 10 wherein said memory means is located within said microcontroller.

18. The method of claim 11 further including the step of providing trimming data adjustment means within said microcontroller logic means for altering said trimming data after said trimming data has been transferred to said memory means.

19. A microcontroller circuit having firmware selectable oscillator trimming comprising, in combination:

a microcontroller;

oscillator means located within said microcontroller for providing a system clock signal for said microcontroller wherein said oscillator means generating an oscillatory signal of a predetermined frequency across a series resistor-capacitor (RC) network by ensuring that the oscillatory signal accurately oscillates between first and second voltages generated from a supply voltage source where the frequency of oscillation is determined by both the time constant of the RC network and the difference between the first and second voltages, said oscillator means comprising, in combination:

charging-discharging means for discharging a voltage across the capacitor commencing when voltage of the oscillatory signal exceeds a first threshold voltage and for charging said voltage across the capacitor commencing when voltage of the oscillatory signal falls below a second threshold voltage;

first sampling means coupled to said charging-discharging means for obtaining a first sampled voltage of the oscillatory signal upon commencement of discharging of said voltage across the capacitor;

first compensation means coupled to said first sampling means for adjusting said first threshold voltage to be the first voltage modified by a voltage difference between the first voltage and said first sampled voltage;

second sampling means coupled to said charging-discharging means for obtaining a second sampled voltage of the oscillatory signal upon commencement of charging of said voltage across the capacitor;

second compensation means coupled to said second sampling means for adjusting said second threshold voltage to be the second voltage modified by a voltage difference between the second voltage and said second sampled voltage; and differential voltage setting means coupled to said second compensation means for selecting the second voltage from a plurality of different possible voltages and thereby selecting a voltage difference between the first and second voltages;

memory means coupled to said oscillator means for providing signals to said oscillator means for trimming frequency of said system clock;

microcontroller logic means having trimming data stored therein for providing said trimming data to said memory means;

said microcontroller logic means also including oscillator control means therein for selecting between use of said oscillator means internal to said microcontroller for said system clock and use of an external oscillator source for said system clock;

oscillator logic means coupled to said microcontroller logic means, to said oscillator means, and to said external oscillator source for providing, in response to receipt of a signal from said oscillator control means, said system clock to said microcontroller from one of said oscillator means and said external oscillator source;

said memory means comprising Static Random Access Memory (SRAM) having control register means for storing said trimming data and supplying said trimming data to said oscillator means; and trimming data adjustment means within said microcontroller logic means for altering said trimming data after said trimming data has been transferred to said memory means.

* * * * *